(12) United States Patent  
Takahashi et al.

(10) Patent No.: US 7,035,154 B2
(45) Date of Patent: Apr. 25, 2006

(54) SEMICONDUCTOR MEMORY DEVICE AND ITS TEST METHOD AS WELL AS TEST CIRCUIT

(75) Inventors: Hiroyuki Takahashi, Kanagawa (JP); Yoshiyuki Katou, Kanagawa (JP); Hideo Inaba, Kanagawa (JP); Shouzou Uchida, Kanagawa (JP); Masatoshi Sonoda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 152 days.

(21) Appl. No.: 10/362,891

(22) PCT Filed: Aug. 30, 2001

(86) PCT No.: PCT/JP01/07486

§ 371 (c)(1),
(2), (4) Date: Aug. 21, 2003

(87) PCT Pub. No.: WO02/19339

PCT Pub. Date: Mar. 7, 2002

(65) Prior Publication Data

US 2004/0027898 A1     Feb. 12, 2004

(51) Int. Cl.
 *G11C 29/00*   (2006.01)
 *G11C 7/00*   (2006.01)
(52) U.S. Cl. .................. 365/201; 365/222; 365/230.03
(58) Field of Classification Search .............. 365/201, 365/222, 230.03
See application file for complete search history.

(56) References Cited

U.S. PATENT DOCUMENTS

| 5,265,102 | A | * | 11/1993 | Saito | 714/743 |
| 5,295,109 | A |   | 3/1994 | Nawaki | |
| 5,818,772 | A | * | 10/1998 | Kuge | 365/201 |
| 5,844,914 | A |   | 12/1998 | Kim et al. | |
| 6,065,143 | A | * | 5/2000 | Yamasaki et al. | 365/201 |

FOREIGN PATENT DOCUMENTS

| JP | 1-125796 | 5/1989 |
| JP | 4-372790 | 12/1992 |
| JP | 5-217366 | 8/1993 |
| JP | 10-69800 | 3/1998 |

* cited by examiner

*Primary Examiner*—Huan Hoang
(74) *Attorney, Agent, or Firm*—Muirhead and Saturnelli, LLC

(57) ABSTRACT

The present invention provides a semiconductor memory device capable of checking operation in the worst case in address combinations, and its manufacturing method. Specific data for test are written into a memory cell array 30. Then, a test signal TE1 is set "1" to set a device in a test mode. Refresh addresses for test are then stored in a data store circuit 51. A first address for test is applied to an address terminal 21, whereby a normal read or write operation is accomplished based on the first address for test. A second address for test is applied to the address terminal 21, whereby a refresh operation is accomplished based on the address for test, and subsequently another normal read or write operation is accomplished based on the second address for test. Data of the memory cell array 30 are checked to decide the presence or absence of any abnormality.

36 Claims, 7 Drawing Sheets

SEMICONDUCTOR MEMORY DEVICE AND ITS TEST METHOD AS WELL AS TEST CIRCUIT

BACKGROUND OF THE INVENTION

1. Field of the Invention

The present invention relates to a semiconductor memory device, and its test method as well as a test circuit integrated in the semiconductor memory device.

2. Prior Art

It is necessary for the semiconductor memory device to make a variety of test before shipment, for which purpose in may cases, a test circuit has previously been provided in the semiconductor memory device.

FIG. 1 is a block diagram of a semiconductor memory device with such a test circuit, for example, one structural example of a pseudo SRAM (a pseudo static random access memory). The structure of this conventional semiconductor memory device is disclosed in Japanese Laid-open Patent Publication No. 1-125796. This semiconductor memory device has the following structure.

A memory array 1 has a plurality of memory cells which store data. A sense amplifier 2 is connected to the memory cell array 1 for amplifying data from the memory array 1. A column I/O circuit 3 becomes connected to a bit line of the memory cells in the memory array 1 for selectively activating this bit line. A column decoder 4 receives an input of external addresses A8–A15 and is connected to the column I/O circuit 3, so that the external addresses A8–A15 enter into the column I/O circuit 3, whereby the column I/O circuit 3 selectively activates a bit line based on these external addresses A8–A15. Further, a main amplifier/write buffer 5 is provided for writing or reading data A multiplexer 8 is connected to an output side of a refresh control circuit 12 and also connected to an output side of an address counter 9, so that in accordance with an output signal from a refresh control circuit 12, the multiplexer 8 selects any of externally entered external addresses A0–A7 and the refresh address outputted from the address counter 9. An output side of the multiplexer 8 is connected to a row decoder 7 so that selected one of the external addresses A0–A7 or the refresh address is inputted into the row decoder 7. The row decoder 7 is connected to a word driver 6 so that any one of the external addresses A0–A7 or the refresh address is inputted into the word driver 6. The word driver 6 is connected to a word line of the memory cell in the memory array 1, so that the word driver 6 selectively activates the word line based on the external addresses A0–A7 or the refresh address.

A test mode deciding circuit 10 receives an input of a /CE signal (/ representing a negative logic signal) or a /RFSH signal, so that the test mode deciding circuit 10 decides whether the mode is a test mode or not, and outputs a test signal which indicates the decided result. An output control circuit 14 is connected to an output side of the test mode deciding circuit 10, so that the output control circuit 14 is controlled by the test signal outputted from the test mode deciding circuit 1 and outputs an I/O output switching signal. Further, the output control circuit 14 is connected to the timer circuit 11 and the I/O output switching circuit 15, so that for test, the output control circuit 14 controls the I/O output switching circuit 15, whereby a frequency divided signal outputted from the timer circuit 11 is supplied through the I/O output switching circuit 15 to an I/O terminal.

The refresh control circuit 12 receives inputs of the /CE signal and the /RFSH signal, so that if those signals satisfy predetermined conditions, then the refresh control circuit 12 performs refresh operations of the memory cells. The above-described timer circuit 11 outputs a refresh request signal periodically at a constant time interval. The timer circuit 11 is connected to the refresh control circuit 12 so that the refresh request signal is inputted into the refresh control circuit 12. A timing generating circuit 13 is connected to this refresh control circuit 12 for receiving an input of the refresh control signal outputted from the refresh control circuit 12 and also receives external inputs of an /RE signal, an /OE signal and a CS signal, so that the timing generating circuit 13 outputs an internal synchronizing signal and controls operations of the entirety of the circuit.

In such configurations, if the /RFSH signal is a low level (L) at a time when the /CE signal is transited from a high level (H) to a low level (L), then the test mode deciding circuit 10 decides that the mode is the test mode. In this case, the test mode deciding circuit 10 transmits a signal through the output control circuit 14 and outputs this signal for oscillating the timer circuit 11, whereby the refresh control circuit 12 operates the address counter 9 and controls the multiplexer 8, so that the refresh address (n-address) of the address counter 9 is outputted from the multiplexer 8 as the row address of the memory cells. The external addresses A8~A15 are entered as the column addresses to the column decoder 4.

In the above manners, a memory cell of a designated address by the row address of n-address and the column addresses A8~A15, so that a read out operation of data content of the cell is accomplished. Accordingly, the specific data have previously been written into the cell of this address so that in the test mode, the content in the cell is directly read out, thereby accurately deciding whether or not data have correctly been written and read out. Namely, it is possible to accurately decide whether or not the timer circuit 11 and the address counter 9 normally operate.

When the mode is set into the test mode, the timer circuit 11 is oscillated, wherein the frequency divided signal outputted from the timer 11 is supplied through the output switching circuit 15 to the I/O7 terminal. Checking the frequency divided output signal results in an accurate decision on whether or the timer circuit 11 normally operates.

Issue to be Solved by the Invention

The above described pseudo SRAM is a semiconductor memory device which has the same memory cell structure as the DRAM (dynamic random access memory), and has the same condition in use as the SRAM, wherein it is necessary to internally perform a self-refresh of the memory cells every when a predetermined time passes.

The address of the memory cell to be self-refreshed or the refresh address is generated by the inside of the circuit, for which reason the refresh address is completely irrelevant to the externally suppleid read/write addresses.

In the worst case, for example, it is possible that adjacent two of the word lines are sequentially activated, wherein the common bit line is activated. In this case, it is possible that any memory malfunction appears due to an insufficient pre-charge and a slight leakage of current under a field insulating film.

The test conducted by the above-described semiconductor memory device is, however, only to check the operations of the timer circuit 11 and also sequentially read out the data of the memory cells by sequentially changing the counted value of the address counter 9. It is impossible to intentionally check the operations or make the test in the worst case which is likely to cause the above-described malfunction.

In consideration of the above-described circumstances, an object of the present invention is to provide a semiconductor memory device which is capable of checking operations under any conditions.

A further object of the present invention is to provide a test circuit integrated in a semiconductor memory device and capable of checking operations under any conditions.

A furthermore object of the present invention is to provide a test method capable of checking operations a semiconductor memory device under any conditions.

Means for Solving the Issue

The present invention was made to solve the above-issues, and provides a test method for a semiconductor memory device with a plurality of memory cells which need refreshes, wherein during a test operation, there is accomplished, at least one time, a combination of: a read/write process for reading or writing the memory cell based on a first address externally entered; and a refresh process for refreshing the memory cells based on a second address externally entered.

The combination of two processes may optionally be that after the refresh process is made, then the read/write process is made.

The combination of two processes may optionally be that after the read/write process is made, then the refresh process is made.

The combination of two processes may optionally be made in one cycle.

The read/write process and subsequent the refresh process and further subsequent the read/write process may optionally be accomplished in one cycle.

The two processes may optionally be made at a common column address and at row addresses close to each other.

The two processes may optionally be made at a common column address and at row addresses adjacent to each other.

The test method for a semiconductor memory device may optionally further include a process of discontinuing the refresh of the memory cell based on a third address generated inside of the semiconductor memory device, in response to a switch of the semiconductor memory device from a normal operation mode to a test mode.

When the normal operation mode is switched to the test mode based on a mode switching signal externally entered, the test address may be selected from the third address and the test address, so that the refresh of the memory cell based on the third address may be discontinued.

The semiconductor memory device may optionally be switched from the normal operation mode to the test mode based on a mode switching signal externally entered.

When the normal operation mode may be switched to the test mode based on the mode switching signal externally entered, the test address may be selected from the third address and the test address, so that the refresh of the memory cell based on the third address may be discontinued.

The test operation may optionally be that a set of plural row addresses is subject to the refresh operation with fixing a column address and sequentially changing row addresses.

The test operation may optionally be that a set of all row addresses is subject to the refresh operation with fixing a column address and sequentially changing row addresses.

The test operation may optionally be that a set of respective all row addresses for each of plural blocks divided from a memory cell array is subject to the refresh operation with fixing a column address and sequentially changing row addresses.

Both the first address and the second address may optionally be externally entered every changes of the row address.

The first address may optionally be externally entered every changes of the row address, while only an initial address of the second address is externally entered, and the second address may be automatically changed in accordance with a predetermined constant rule every changes to the row address.

A predetermined increment of the second address may optionally be made every changes to the row address.

A hold test of a memory cell to be subject to the test may be previously tested and a predetermined test pattern may be written, before the two processes may be accomplished.

The present invention provides a semiconductor memory device having a plurality of memory cells which need refresh, a circuit element for supplying a first address, and an access address control circuit for refreshing the memory cell based on an address, wherein the semiconductor memory device further has: a circuit for holding a second address externally entered; and a refresh address switching circuit electrically coupled to the circuit element for supplying the first address and also coupled to the circuit for holding the second address, and in a normal operation mode, the refresh address switching circuit supplies the first address to the access address control circuit, and in a test mode, the refresh address switching circuit supplies the second address to the access address control circuit.

The refresh address switching circuit may optionally comprise a selecting circuit which is electrically coupled to the circuit element for supplying the first address and also coupled to the circuit for holding data, and in the normal operation mode, the selecting circuit selects the first address, and in the test mode, the selecting circuit selects the second address.

The selecting circuit may optionally comprise a multiplexer electrically coupled to the circuit element for supplying the first address and also coupled to the circuit for holding data.

The semiconductor memory device may optionally further include: a control circuit electrically coupled to the refresh address switching circuit for supplying the refresh address switching circuit a control signal which switches between the normal operation mode and the test mode.

The control circuit may optionally comprise a test entry circuit which switches between the normal operation mode and the test mode in response to a predetermined external signal.

The circuit for holding the second address may optionally comprise a data storage device electrically coupled to the refresh address switching circuit.

The semiconductor memory device may optionally further include an address inverting circuit electrically coupled to between the circuit for holding data and the refresh address switching circuit for inverting the second address outputted from the data storage device, and supplying the same to the refresh address switching circuit.

The circuit element for supplying the first address may optionally comprise a refresh address generating circuit connected to the refresh address switching circuit.

The present invention provides a test circuit for a semiconductor memory device, the circuit having a plurality of memory cells which need refresh and a circuit element for supplying a first address based on an internal signal, wherein the test circuit has: a circuit for holding a second address externally entered; and a refresh address switching circuit electrically coupled to the circuit element for supplying the first address and also coupled to the circuit for holding the second address, and in a normal operation mode, the test circuit supplies the first address to the access address control circuit, and in a test mode, the test circuit supplies the second address to the access address control circuit.

The refresh address switching circuit may optionally comprise a selecting circuit which is electrically coupled to the circuit element for supplying the first address and also coupled to the circuit for holding data, and in the normal operation mode, the selecting circuit selects the first address, and in the test mode, the selecting circuit selects the second address.

The selecting circuit may optionally comprise a multiplexer electrically coupled to the circuit element for supplying the first address and also coupled to the circuit for holding data.

The test circuit may optionally further include: a control circuit electrically coupled to the refresh address switching circuit for supplying the refresh address switching circuit a control signal which switches between the normal operation mode and the test mode.

The control circuit may optionally comprise a test entry circuit which switches between the normal operation mode and the test mode in response to a predetermined external signal.

The circuit for holding the second address may optionally comprise a data storage device electrically coupled to the refresh address switching circuit.

The test circuit may optionally further include an address inverting circuit electrically coupled to between the circuit for holding data and the refresh address switching circuit for inverting the second address outputted from the data storage device, and supplying the same to the refresh address switching circuit.

The test circuit may optionally be integrated in the semiconductor memory device, or be separated from the semiconductor memory device and be mounted on a same chip as the semiconductor memory device. In either configuration, there is no problem, provided that the test circuit is electrically coupled to the semiconductor memory device, and signals and addresses are transmitted between the test circuit and the semiconductor memory device.

MODE FOR CARRYING OUT THE INVENTION

One embodiment of the present invention will, hereinafter, be described with reference to the drawings. In the following embodiment, one structural example is shown, wherein the test circuit is integrated in the semiconductor memory device.

Figure 1:
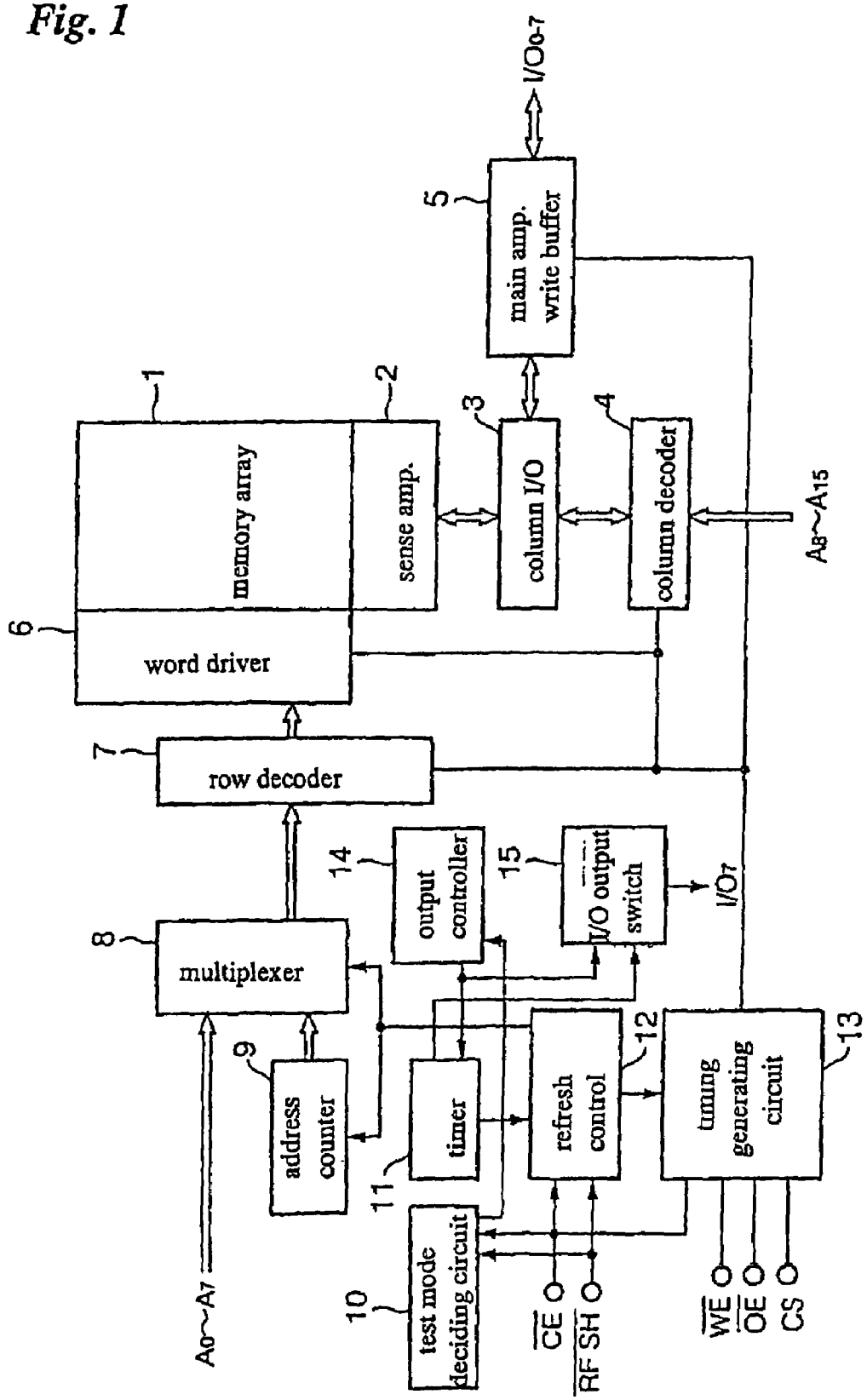
FIG. 1 is a block diagram showing the structural example of the conventional semiconductor memory device.
Figure 2:
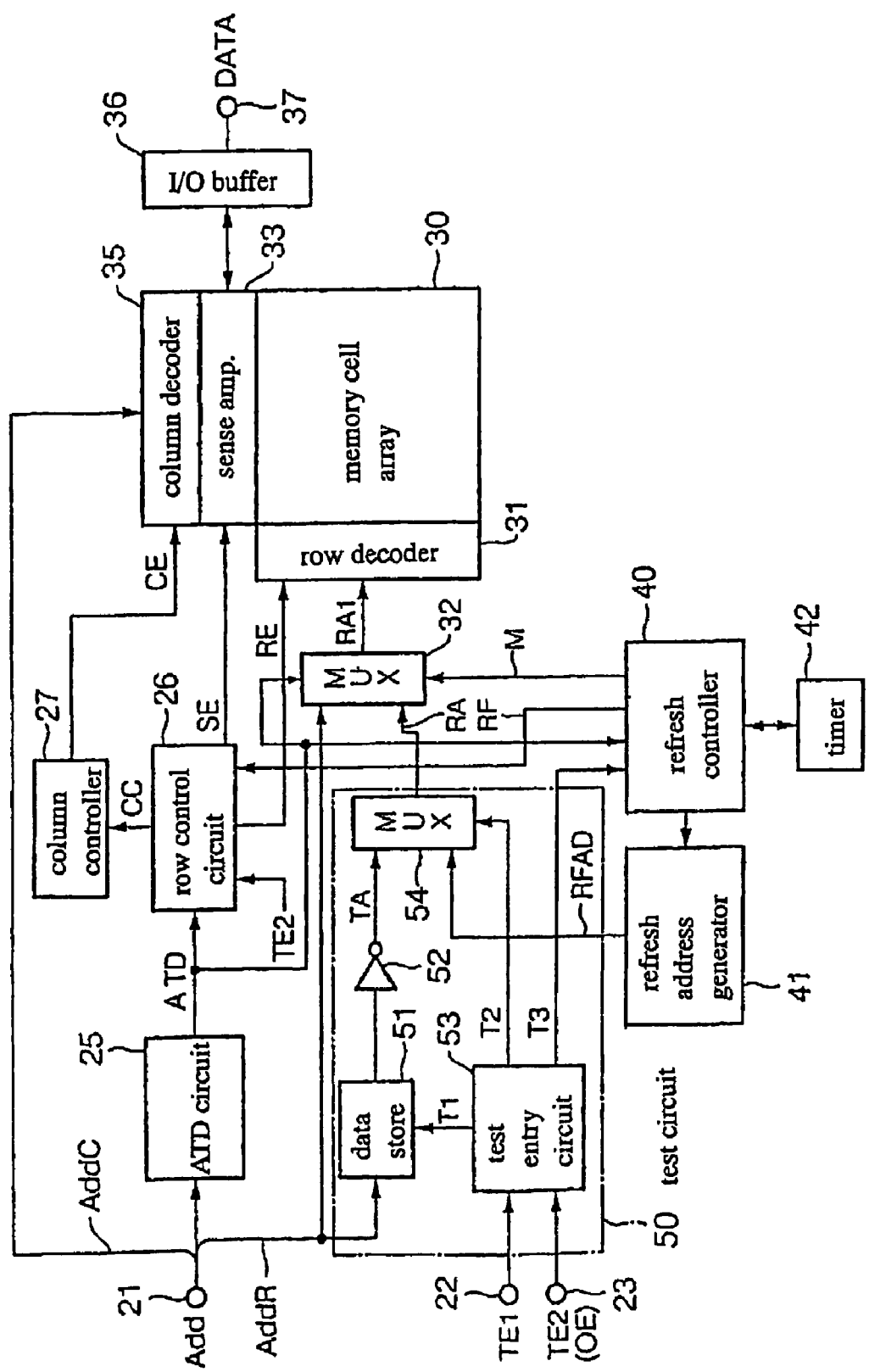
FIG. 2 is a block diagram showing a structure of one embodiment of this invention.
Figure 3:
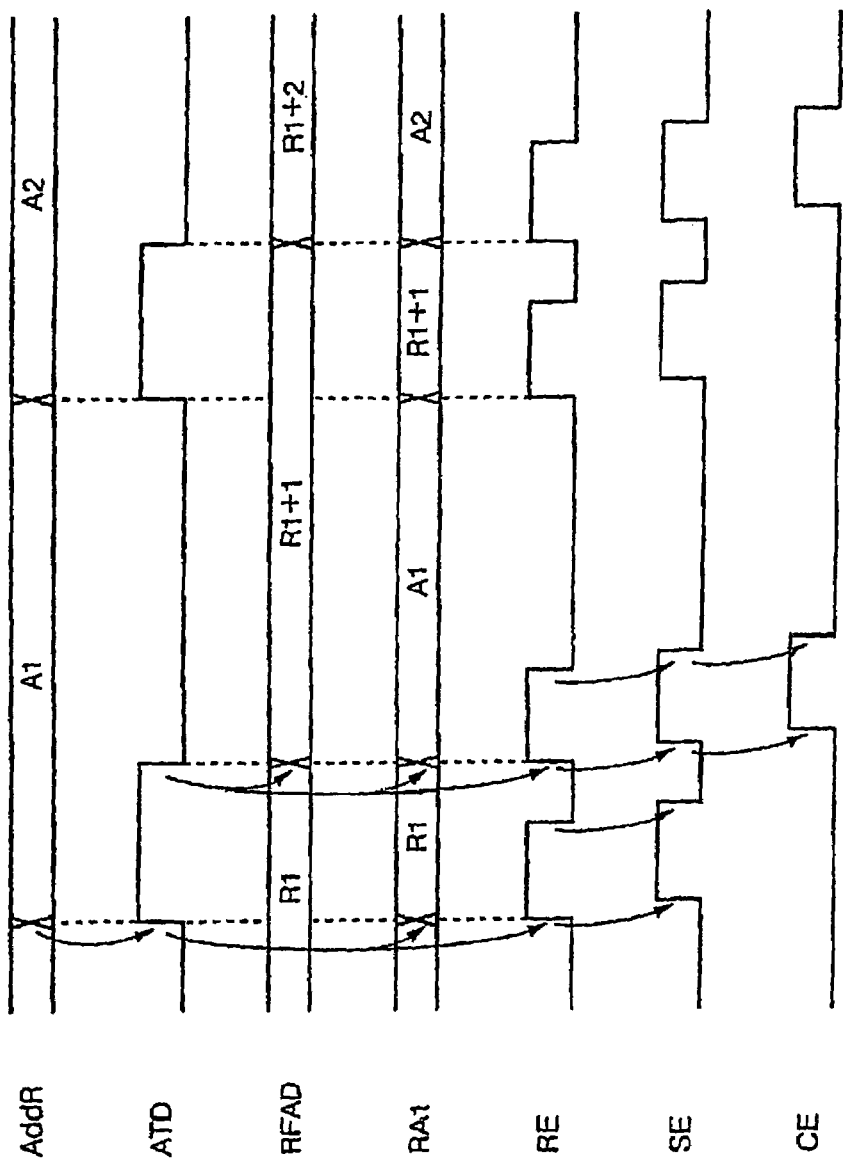
FIG. 3 is a timing chart describing a normal operation in the embodiment.

FIG. 2 is a block diagram showing a circuit configuration of a semiconductor memory device (pseudo SRAM) in accordance with this embodiment. FIG. 3 is a timing chart of output signals from respective circuits of the semiconductor memory device shown in FIG. 2. The circuit configuration of the semiconductor memory device (pseudo SRAM) will be described with reference to FIG. 2, while the output signals from the respective circuits will be described with reference to FIG. 3. A read/write address Add is applied to an address terminal 21 from outside. A terminal 22 is applied with a first test signal TE1 from outside. A terminal 23 is applied with a second test signal TE2 from outside. Only the terminal 22 is a terminal dedicated for the test. The terminal 21 is applied with the read/write address Add in the normal operation. The terminal 23 is also applied with an output enable signal OE in the normal operation and serves as a terminal for receiving the test signal.

An address transition detector circuit (ATD circuit) 25 is connected to the terminal 21 for receiving an input of the read/write address Add which was applied to the terminal 21 from outside, so that the address transition detector circuit 25 detects any transition of row address data AddR (see FIG. 3) included in this address data Add. If at least one bit in all bits of the row address data AddR is transitioned, then the address transition detector circuit (AD circuit) 25 detects the transition and outputs a pulse signal ATD.

A row control circuit 26 is connected to an output side of the address transition detector circuit (ATD circuit) 25, so that, based on the pulse signal ATD outputted from the address transition detector circuit (ATD circuit) 25, the row control circuit 26 generates and outputs a row enable signal RE, a sense enable signal SE and a column control signal CC. As shown in FIG. 3, the row enable signal RE is a pules signal which rises at a rising time and a falling time of the pulse signal ATD, and then falls after a predetermined time passes from those times. The sense enable signal SE is a signal delayed by a predetermined time from the row enable signal RE. Even not shown in the drawing, the column control signal CC is a later one of two sequential row enable signals RE, namely a signal delayed by a predetermined time from the pulse signal based on the falling of the signal ATD. When the second text TE2 is "0" or in the low level, the row control circuit 26 does not output the row enable signal RE.

A column control circuit 27 is connected to the row control circuit 26 for receiving the column control signal CC outputted from the row control circuit 26 and further delays the column control signal CC, and outputs a column enable signal CE.

A memory cell array 30 has a similar structure as a memory cell array of DRAM. A row decoder 31 is connected to word lines of the memory cell array 30 and also connected to the row control circuit 26, so that at a timing when the row enable signal RE outputted from the row control circuit 26 becomes "1", the row decoder 31 selectively activates a word line of the memory cell array 30, wherein the word line corresponds to row address data RA1 outputted from a multiplexer (MUX) 32.

A sense amplifier 33 is connected to each bit line of the memory cell array 30 and also connected to the row control circuit 26, so that the sense amplifier 33 activates each bit line of the memory cell array 30 at a timing when the sense enable signal SE outputted from the row control circuit 26 becomes "1".

A column decoder 35 is connected to the above-described terminal 21 and the column control circuit 27, so that at a timing when a column enable signal CE outputted from the column control circuit 27 becomes "1", the column decoder 35 decodes column address data AddC included in the address data Add applied to the terminal 21, so that a sense amplifier corresponding to this decode result is connected through an I/O buffer 36 to an input/output data terminal 37.

A refresh control circuit 40 is a circuit for self-refresh of the memory cell array 30. This refresh control circuit 40 is connected to an output side of the address transmission detector circuit (ATD circuit) 25 for receiving the pulse signal ATD and outputs a pulse signal and a reset signal at a time when the pulse signal AID falls. The refresh control circuit 40 is further connected to a timer 42 and a refresh address generating circuit 41, so that the refresh control circuit 40 outputs a pulse signal at a time when the pulse signal ATD falls, and the pulse signal as outputted is entered into the refresh address generating circuit 41, and the reset signal is entered into the timer 42. The refresh address generating circuit 41 receives the pulse signal and makes an increment by one of the refresh address RFAD.

The above-described refresh control circuit 40 detects, based on a timer signal from the timer 40 that any output of the pulse signal ATD from the address transition detector circuit (ATD circuit) does not appear for a predetermined time, so that the refresh control circuit 40 outputs a self-refresh signal RF. An output side of the refresh control circuit 40 is connected to the row control circuit 26, so that the self-refresh signal RF as outputted is entered into the row control circuit 26.

Further, a test circuit 50 for testing a pre-shipment complete product receives inputs of first and second test signals which were applied to the terminals 22 and 23, and the test circuit 50 outputs an output signal T3 and a refresh address RA. The refresh control circuit 40 is connected to the test circuit 50 for receiving an input of the output signal T3 and then outputting a signal M and a self-refresh signal RF, whereby a self-refresh of the memory cell array 30 is conducted.

The test circuit 50 comprises a data store circuit 51, an inverter circuit 52, a test entry circuit 53 and a multiplexer 54. The data store circuit 51 captures and outputs row address data AddR included in the address data Add which were applied to the terminal 21, at a timing when the signal T1 outputted from the text entry circuit 53 rises. The row address data AddR as outputted is entered into the inverter circuit 52. The inverter circuit 52 inverts respective bits outputted from the data store circuit 51 and outputs a test address TA. The test entry circuit 53 is connected to the terminals 22 and 23, and the test entry circuit 53 outputs signals T1~T3 based on the first and second test signals TE1 and TE2 which were applied to those terminals. The multiplexer 54 selects any one of the test address TA from the inverter circuit 52 and the refresh address RFAD from the refresh address generating circuit 41, based on the signal T2 from the test entry circuit 53, and the multiplexer 54 outputs a signal RA This signal RA is entered into the above-described multiplexer 32.

The test mode operation and the normal operation of the above-described semiconductor memory device will be described separately.

Initially, the normal operation will be described with reference to FIG. 3. In this mode, the test signal TE1 is set at "0", whereby the signals T1~T3 outputted from the test entry circuit 53 become "0". In the normal operation, the test circuit 50 does not operate, and thus the operation is substantially the same as the semiconductor integrated circuit free of any integration of the test circuit.

In this state, when data "A1" as the row address data AddR are applied to the terminal 21, the ATD circuit 25 detects that the data "A1" were applied, whereby the pulse signal ATD ("1") is entered into the row control circuit 26 and the multiplexer 32. The multiplexer 32 receives the pulse signal ATD ("1 ") and outputs data RA from the multiplexer 54 as the row address data RA1. The row address data RA1 are then entered into the row decoder 31.

Since the signal T2 is "0", the multiplexer 54 outputs the refresh address RFAD which is supplied through the multiplexer 32 to the row decoder 31, provided that the refresh address RFAD was "R1".

On the other hand, the row control circuit 26 receives the pulse signal ATD and outputs the row enable signal RE. This row enable signal RE is entered into the row decoder 31. The row decoder 31 receives this row enable signal RE and activates a word line designated by the above-described address data "R1".

Subsequently, the row control circuit 26 outputs the sense enable signal SE which is then supplied to the sense amplifier 33, whereby the sense amplifier is activated. After the sense amplifier 33 is activated, a memory cell connected to a word line designated by the above-described row address data "R1" is refreshed.

When the pulse signal ATD falls, the refresh control circuit 40 supplies a pulse signal to the refresh address generating circuit 41, whereby the refresh address RFAD is incremented and becomes "R1+1". Simultaneously, the timer 42 is reset. When the pulse signal ATD falls, the multiplexer 32 supplies the row decoder 31 the data AddR (data "A1" at this time) as the row address data RA1. When the pulse signal ATD falls, the row control circuit 26 supplies the row enable signal RE to the row decoder 31.

The row decoder 31 receives the row enable signal RE and activates a word line of the memory cell array 30, wherein the word line is designated by row address data "A1" outputted from the multiplexer 32. Subsequently, the row control circuit 26 outputs the sense enable signal SE which is then supplied to the sense amplifier 33, whereby a word line corresponding to the address data "A1" of the sense amplifier 33 is activated.

Subsequently, the column control circuit 27 supplies the column enable signal CE to the column decoder 35. The column decoder 35 receives the column enable signal CE and decodes a column address data AddC, so that a sense amplifier corresponding to this decode result is connected through the I/O buffer 36 to the input/output data terminal 37. In case of read operation, data stored in the memory cell array 30 are transmitted through the sense amplifier 33 and the I/O buffer 36 to the data terminal 37. In case of write operation, data on the data terminal 37 are written into the memory cell array 30.

As described above, in accordance with the semiconductor memory device of FIG. 2, after the read/write address data Add are applied to the address terminal 21, a refresh of a memory cell connected to a word line designated by the refresh address RFAD is made and subsequently a read/write operation of the memory cell array 30 is made based on the address data Add.

If the read/write operation of the memory cell array 30 has not been conducted within a predetermined time period, then the timer 42 supplies the pulse signal to the refresh control circuit 40. The refresh control circuit 40 receives the pulse signal and conducts the self-refresh. Namely, the refresh signal RP is supplied to the row control 26, and the signal M of "1" is supplied to the multiplexer 32. The multiplexer 32 receives this signal M and supplies the row decoder 31 the refresh address RFAD (data "R1+1 ") as the row address data RA1.

The refresh signal RF is supplied to the row control circuit 26, and then the row control circuit 26 supplies the row enable signal RE to the row decoder 31 and subsequently supplies the sense enable signal SE to the sense amplifier 33, whereby a memory cell connected to a word line corresponding to the row address data "R1+1" is refreshed similarly to the above case.

The above descriptions are the normal operations of the semiconductor memory device shown in FIG. 2.

Subsequently, the pre-shipment test operation using the test circuit 50 will be described with reference to FIG. 4, which is a timing chart for describing the test operation.

A variety of patterns as test patterns for the pre-shipment test may be considered. As one example, it is possible to conduct the test, wherein a read/write "address B" is "X1", and "refresh address A" is an inverted address "/X1" of "X1". The following descriptions will be made by taking one example that the read/write "address B" is "X1" and "refresh address A" is the inverted address "/X1".

In this pre-shipment test, at a time t1, the test signal TE1 rises up to "1", whereby the test entry circuit 53 enters into the test mode, and thereafter the test entry circuit 53 recognizes any signals applied to the terminal 23 to be the second test signal TE2. Subsequently, the address data "X1" are applied to the terminal 21. At a time t2, the second test signal TE2 applied to the terminal 23 falls to "0".

The second test signal TE2 falls to "0", then the test entry circuit 53 detects this fall, and rises the signal T1 to "1". The signal T1 rises to "1", and upon this rising, the data store circuit 51 captures the address data AddR applied to the address terminal 21, namely the address data "X1", whereby the address data "X1" are then supplied to the inverter circuit 52. The inverter circuit 52 inverts the address data "X1" and outputs the same as data "/X1". The inverted address data "/X1" are supplied as the test address data to the multiplexer 54.

In the above embodiment, as described above, the inverter 52 is interposed between the data store circuit 51 and the multiplexer 54. Thus, it is possible to conduct the refresh at the inverted address "/X1" and the read/write operation at the address "X1" without any change to the address data "X1" to be applied to the address terminal 21. Namely, in the read or write operation, the multiplexer 32 selects the address "X1" which was entered through the address terminal 21 so that the read or write operation is made at the address "X1". In the refresh operation, the multiplexer 32 selects the inverted address "/X1" which was entered through the address terminal 21 and inverted by the inverter 52, so that the read or write operation is made at the inverted address "/X1".

The address data "X1" supplied from an external tester may be used commonly for both the read or write operation and the refresh operation. This may make it easy to prepare he test patterns and also make a test program simple.

In case that the inverter 52 is not provided, it is necessary that the inverted address data "/X1" are applied as the refresh address to the address terminal 21. Every when the read or write address is changed, then the inverted address as the refresh address is needed to be applied to the address terminal 21. As a result, the test program is likely to be complicated. This is more remarkable as a scale of the memory cell array is large.

Accordingly, it is preferable to provide the inverter 52 for allowing the address data applied to the address terminal 21 to be used commonly for both the read or write operation and the refresh operation. The inverter 52 is mere circuit design choice and not essential for the test circuit. For example, depending upon the test pattern, it is not necessary that the read or write address B is "X1", the refresh address A is the inverted address "/X1" of "X1". In this case, it is unnecessary to provide, on purpose, the inverter 52.

At a time t3, the address data "X1" as the read/write address "B" as the address data AddR are applied to the address terminal 21. The address data "X1" are applied to the address terminal 21, and as described above, the pulse signal ATD is outputted from the ATD circuit 25. The outputted pulse signal MD is entered into the row control circuit 26. Since at this time, the test signal TE2 is "0", then the row enable signal RE and the sense amplifier enable signal SE are not outputted from the row control circuit 26.

The second test signal TE2 rises to "1" at a time t4, that a predetermined time (a time slightly longer than a pulse width of the pulse signal ATD) passes from the time t3 when the address data "X1" was applied to the terminal 21. The test signal TE2 rises to "1", and then the test entry circuit 53 detects this rising, and the signals T2 and T3 rise to "1". The signal T2 rises to "1", then the multiplexer 54 outputs the test address data TA as the address data RA.

At this time t4, the signal 13 rises, and the refresh control circuit 40 detects this rising, and supplies the self-refresh signal RF to the row control circuit 26 and also supplies the signal M to the multiplexer 32. The signal M is entered into the multiplexer 32, and the multiplexer 32 supplies the address data AddR (the data "X1" at this time) to the row decoder 31. When the signal RF is entered into the row control circuit 26, the second test signal TE2 has already risen to "1". Thus, the row enable signal RE is outputted from the row control circuit 26. This row enable signal RE is then entered into the row decoder 31, whereby a word line designated by the address data "X1" is activated. Subsequently, the sense enable signal SE is outputted from the row control circuit 26, and then he sense amplifier 33 is activated, and the read/write is made to the word line designated by the address data "X1".

At a time t5, address data "C" are applied to the address terminal 21. When the address data "C" are applied to the address terminal 21, then the ATD circuit 25 detects this, and supplies the pulse signal ATD ("1" to the multiplexer 32 and the row control circuit 26. The multiplexer 32 selects an output from the multiplexer 54, namely the test address TA (the address data "/X1" as the refresh address A at this time), and then supplies the selected data to the row decoder 31. As the pulse signal AD is supplied to the row control circuit 26, the second test signal TE2 has been "1", and thus the row enable signal RE is outputted from the row control circuit 26, and the row enable signal RE as outputted is then entered into the row decoder 31, whereby the word line designated by the address dara "/X1" is activated. Subsequently, the sense enable signal SE is outputted from the row control circuit 26, and the sense amplifier 33 is activated, whereby the memory cell connected to the word line designated by the address data "/X1" is refreshed.

At a time t6, the pulse signal ATD falls to "0", then the multiplexer 32 supplies the address data AddR (data C at this time) to the row decoder 31. When the pulse signal ATD falls to "0", and the row enable signal RE is outputted from the row control circuit 26. The row enable signal RE as outputted is entered into the row decoder 31, whereby a word line designated by the address data "C" is activated. Subsequently, the sense enable signal SE is outputted from the row control circuit 26, and the sense amplifier 33 is activated, and a read/write operation of the word line designed by the address data "C" is made.

As described above, the test circuit 50 shown in FIG. 2 is capable of previously setting the test-purpose refresh address (the above address data "A" in the data store circuit 51. Since the refresh address "A" previously set in the data storage circuit 51 could have been previously recognized, it is possible that the test-purpose read/write addresses (the above-described address data "B", "C") adjacent to this refresh address are entered from outside, so that the test under any conditions, for example, the worst condition, may intentionally and surely made.

A word line is designated based on the refresh address "A" for refreshing the memory cell and subsequently an adjacent word line to the above word line is designated based on the test-purpose read/write address for the read/write operation, so that the test is intentionally made, wherein adjacent two of the word lines are sequentially activated with fixing a common bit line. Namely, it is possible to verify whether or not any malfunction of the storing operation appears under any conditions, for example, under the worst condition with an insufficient pre-charge or a slight leakage of current under a field insulating film.

The pre-shipment test using the above-described test circuit 50 will be described with reference to the flow chart of FIG. 5.

If a chip originally has any stationary defect or has a memory cell with a bad hold characteristic, then the test for refresh operation is no sense, for which reason the holding test is needed to be carried out previously (Step S1). The holding test may be made in the known test sequences similarly to those of the test taken place for the general-purpose DRAM.

Namely, data are written into memory cells of the memory cell array 30 and the refresh remains inhibited for a predetermined time, before data are read out from the memory cells, wherein the predetermined time (or refresh cycle) is adjusted so that the read out data correspond to the written data, thereby deciding the hold times of the memory cells. This test is conducted for all of the memory cells, so that it is possible to decide the refresh cycle based on the shortest hold time of the memory cells. The inhibition of the refresh operation may be made by entry of the control signal into the refresh control circuit 40.

Subsequently, in order to make a post-test decision on whether or not the refresh operation and the read/write operation are made correctly, the test patterns have previously been written into the memory cell array 30 (Step S2). In order to investigate the normality of the refresh operation and the read/write operation, the test pattern with all bits of "1" is used.

An optional hold time is set (Step S3). Subsequently, the first test signal TE1 is risen to "1" to set the circuit into the test mode (Step S4).

Subsequently, the refresh address data ("A") are applied to the address terminal 21, to cause the test signal TE2 to be fallen to "0", whereby the address data "A" are written into the data store circuit 51 (Step S5).

Address data ("B") are applied to the address terminal 21, wherein the address data ("B") designate a word line which is connected to the same sense amplifier as a word line which is designated by the address data "A" (Step S6).

After the predetermined time has passed, similarly to the above, Address data ("C") are applied to the address terminal 21, wherein the address data ("C") designate a word line which is connected to the same sense amplifier as a word line which is designated by the address data "A" (Step S7).

Figure 4:
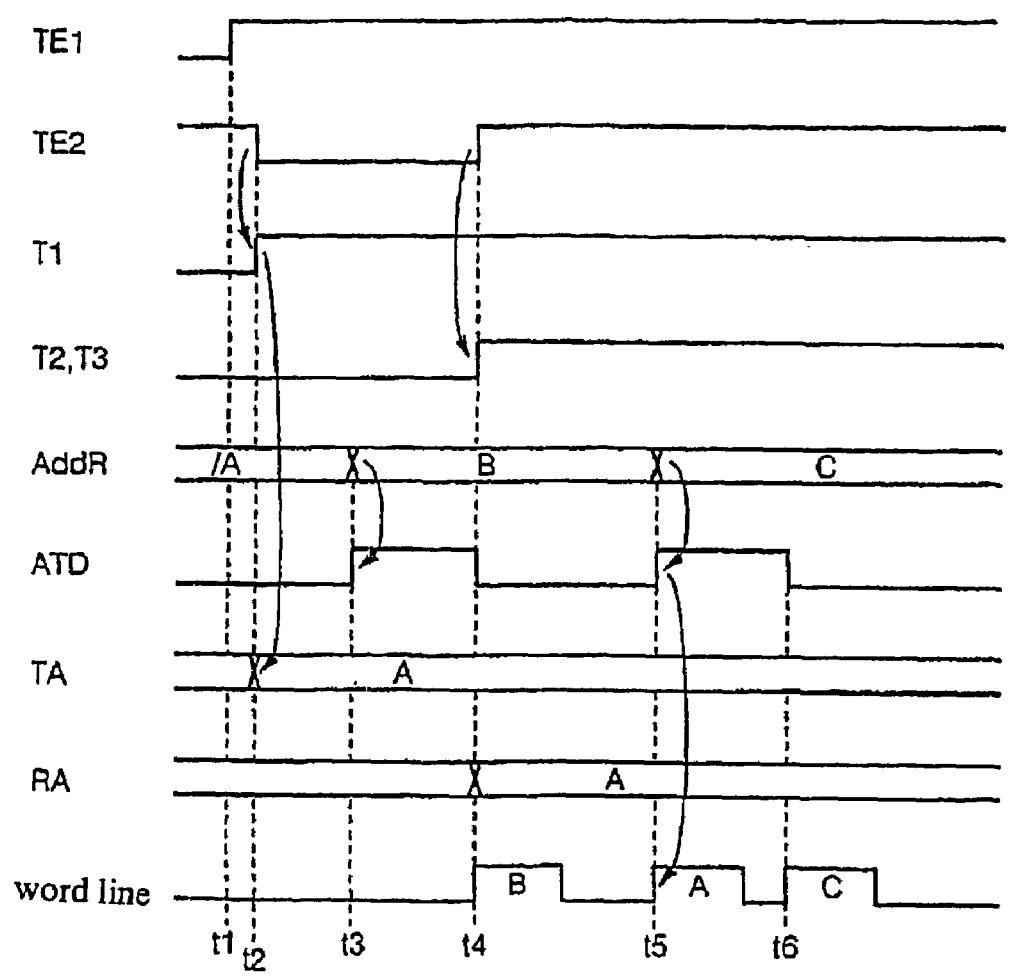
FIG. 4 is a timing chart describing a test operation in the embodiment.

Through the above processes, as shown in FIG. 4, the normal access to the address "B", the refresh operation at the address "A" and the normal access to the address "C" are sequentially conducted.

Subsequently, data stored in the memory cells connected to the respective word lines designated by the above addresses "A", "B" and "C" are read out and then checked (Step S8). If the result of the check is "NG" (Step S9), then the test is finished and the chip is disposed (Step S10). If the result of the check is "PASS" (Step S9), then it is decided whether or not the entirety of the test has been completed (Step S11). If the result of the decision is "NO", then it returns to the step S5.

Thereafter, the above steps S5~S8 are repeated until the result of decision on, whether or not the entirety of the test has been completed, becomes "YES". The test is made for all combinations of the row addresses with the common sense amplifier. For testing the all combinations of the row addresses, it is possible that a word line is fixed as a refresh word line, while the word lines of the normal accesses before and after the refresh operation are sequentially changed. For example, a word line is fixed as a refresh word line, while the word lines of the normal accesses before and after the refresh operation are sequentially changed from the top one to the bottom one.

The above test process will be repeated by fixing another word line as the refresh word line until all of the word lines have been selected as the refresh word line, whereby the test is made for all of the test patterns.

In case that the memory cell array 30 is divided into a plurality of blocks, each of which is allocated with each sense amplifier, the test may be made for all combinations of the row addresses in the each block.

Practically, it take a long time to make the test for all patterns. It is possible alternatively to make the test with disciplined addresses. Namely, initially, all patterns are subject to the test, but after any tendency appears, some of the patterns may be omitted. For the test techniques for not only the DRAM but also the normal memory, there may be a pattern which is likely to find out the defects. For example, a combined test of test methods such as mating or gallop may be effective. Needless to say, it is preferable to conduct the test for all patterns.

In the above-described embodiment, the test is made by changing the row address, independently from the column addresses. In the normal accesses, the bit line is connected through a column switch to a data bus. The data of the memory cells may be influenced depending on how to open the bit lines and pre-charge. Accordingly, it is preferable to conduct the test with further changing the column addresses.

Figure 5:
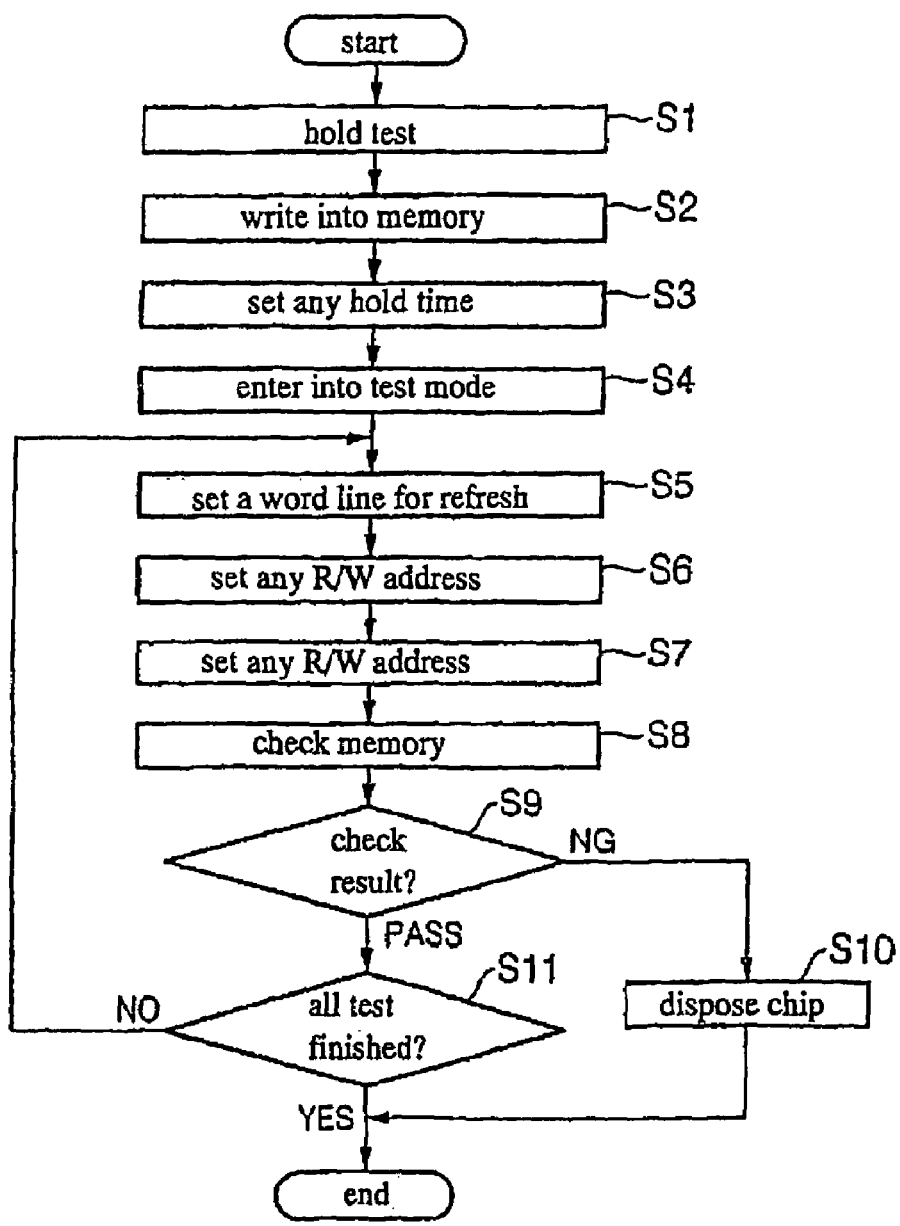
FIG. 5 is a flow chart describing a test operation in the embodiment.
Figure 6:
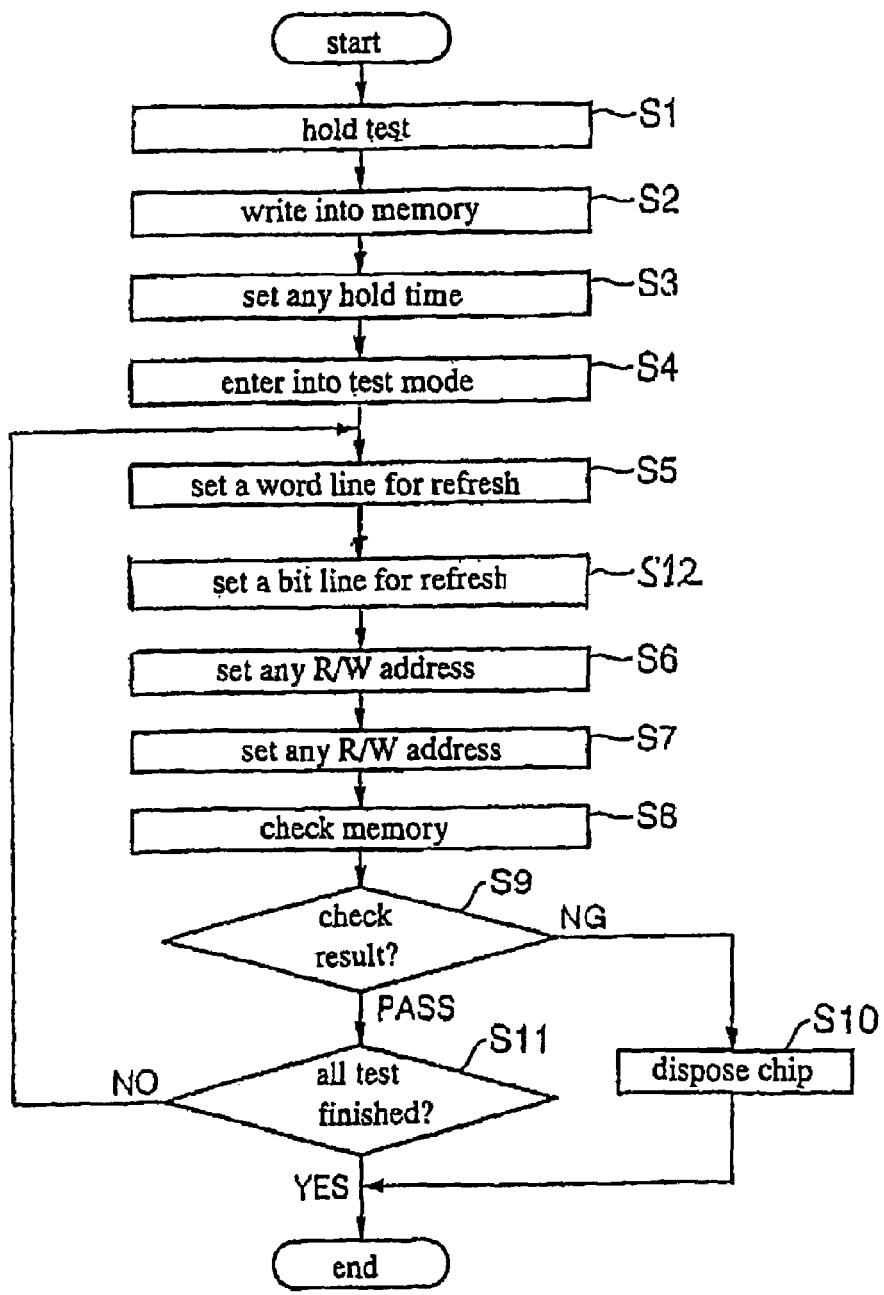
FIG. 6 is another flow chart describing a test operation in the embodiment.

In this case, it is possible to add a process for setting optional column address data AddC following to the step S5 in FIG. 5. FIG. 6 is a flow chart of the test to be conducted by changing not only the row addresses but also the column addresses.

The steps S1~S5 are conducted similarly to the above. Thereafter, data "D" as the column address data AddC are applied to the address terminal 21. The column decoder 35 decodes the column address data AddC, and a sense amplifier corresponding to the decoded result is connected through the I/O buffer 36 to the input/output data terminal 37. Namely, the bit line is designated by the column address data AddC (Step S12). Address data ("B") are applied to the address terminal 21, wherein the address data ("B") designate a word line which is connected to the same sense amplifier as a word line which is designated by the address data "A" (Step S6).

After the predetermined time has passed, similarly to the above, Address data ("C") are applied to the address terminal 21, wherein the address data ("C") designate a word line which is connected to the same sense amplifier as a word line which is designated by the address data "A" (Step S7).

Through the above processes, the normal access to the address "B", the refresh operation at the address "A" and the normal access to the address "C" are sequentially conducted with fixing a bit line designated by the column address AddC.

The same test will be repeated by changing the bit lines designated. In addition to the refresh row address, the column address is also changed for the test in order to investigate whether or not the data of the memory cells may be influenced depending on how to open the bit lines and pre-charge.

In accordance with the above embodiment, enabling to optionally set the address from the outside of the chip increases the flexibility. In other words, designation of all of the addresses should be made from the outside. This is complicated and inconvenience method. It is, however, possible that the above normal access addresses "B" and "C" only are given from the outside, while the refresh address "A" is automatically incremented inside of the circuit, so as to save the programming work for the test program. In this case, it is possible to increment the refresh address by utilizing the address counter in the refresh address generating circuit 41.

In case that the test-purpose refresh address (the above address data "A") is automatically incremented inside of the test circuit 50, the increment is made in accordance with the predetermined rule, for which reason it is possible to previously recognize the incremented refresh address (address data "A+1"). Thus, it is possible that the test-purpose read/write addresses (the above-described address data "B", "C") adjacent to this incremented refresh address are entered from outside, so that the test under any conditions, for example, the worst condition, may intentionally and surely made.

Namely, the word line is designated by the automatically incremented refresh address for taking place the refresh operation of the memory cell, and subsequently the word lines adjacent to the above word line are designated by the test-purpose read/write address for taking place the read/write operation, thereby enabling the test under any optional conditions, for example, the worst condition without designating all of the addresses from the outside.

In the above embodiment, the multiplexer 54 receives the refresh address RFAD outputted from the refresh address generating circuit 41 and also receives the test address TA outputted from the data store circuit 51, and, in the normal operation mode, the multiplexer 54 selects the refresh address RFAD generated in the circuit based on the control signal T2 from the test entry circuit 53, and in the test mode, the multiplexer 54 selects the test address TA entered from the outside. In response to the change from the normal operation mode to the test mode, the supply of the refresh address RFAD generated inside of the circuit is discontinued, so that in the test mode, it is prevented that the refresh operation is made based on the refresh address RFAD generated inside of the circuit.

Figure 7:
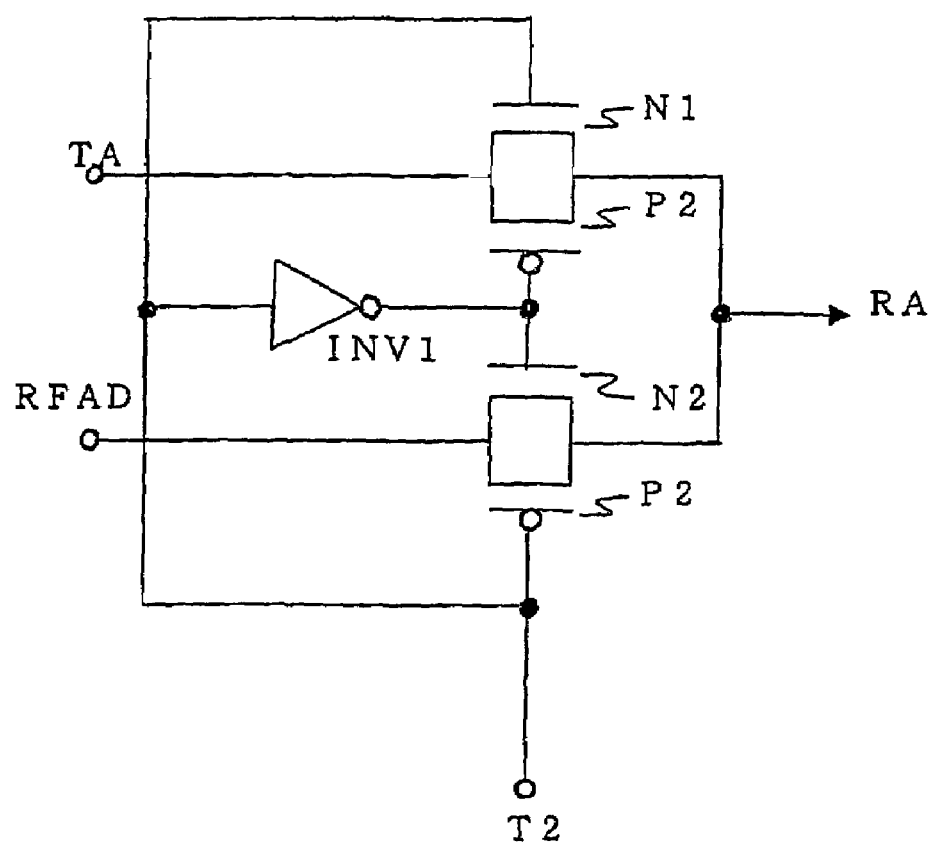
FIG. 7 is a circuit diagram showing one example of a circuit configuration of a multiplexer included in the circuit configuration of FIG. 2.

One example of. the circuit configuration of the above-described multiplexer 54 is shown in FIG. 7. The multiplexer 54 has a first gate further comprising a first n-type transistor N1 and a first p-type transistor P1, a second gate further comprising a second n-type transistor N2 and a second p-type transistor P2, and an inverter INV1. The multiplexer 54 also has a test address input unit for the test address TA which was outputted from the data store circuit 51 and entered through the inverter 52, and a refresh address input unit for receiving an input of the refresh address RFAD outputted from the refresh address generating circuit 41, a control signal input unit for receiving an input of the signal T2 outputted from the test entry circuit 53, and an output unit of the circuit.

The first gate comprising he first n-type transistor N1 and the first p-type transistor P1 is provided between the test address input unit and the output unit. The second gate comprising the second n-type transistor N2 and the second p-type transistor P2 is provided between the refresh address input unit and the output unit.

Further, the control signal input unit is connected to a gate of the first n-type transistor N1, a gate of the second p-type transistor P2, and an input side of the inverter INV1. An output side of the inverter INV1 is connected to a gate of the first p-type transistor P1 and a gate of the second n-type transistor N2.

The signal 12 outputted from the test entry circuit 53 is entered into the gate of the first n-type transistor N1 and the gate of the second p-type transistor P2, while the inverted signal of the signal T2 is entered into the gate of the first p-type transistor P1 and the gate of the second n-type transistor N2.

Accordingly, in the normal operation mode, the signal T2 is in the inactive state or in the low level "L", whereby the first gate comprising the first n-type transistor N1 and the first p-type transistor P1 is closed, while the second gate comprising the second n-type transistor N2 and the second p-type transistor P2 is opened. The test address TA is not outputted, while the refresh address RFAD is outputted, so that the refresh operation is made of the memory cell based on the refresh address RFAD generated inside of the circuit in the normal operation mode.

In the test mode, the signal T2 is in the active state or in the high level "H", whereby the first gate comprising the first n-type transistor N1 and the first p-type transistor P1 is opened, while the second gate comprising the second n-type transistor N2 and the second p-type transistor P2 is closed. The test address TA is outputted, while the refresh address RFAD is not outputted, so that the refresh operation is made under the worst condition of the memory cell based on the test address TA entered from the outside of the circuit in the test mode. The above-multiplexer 54 is mere one example of the circuits which have a function of selecting any one of the test address TA and the refresh address RFAD based on the control signal generated upon transition between the normal operation mode and the test mode. It is not unnecessary to limit the circuit to this multiplexer. It is no problem, provided that the row address for access for the read/write operation in the test mode and the row address for access for the refresh operation are surely controllable from the outside.

In the above embodiment, there was described one case that after the refresh operation is made, then the read/write operation is made. The present invention is also applicable to another case that after the read/write operation is made, then the refresh operation is made.

As described above, the test-purpose refresh address (the above address data "A") may previously be set in the data store circuit 51 and the refresh address "A" may previously be recognized, for which reason it is possible that the test-purpose read/write addresses (the above address data "B" and "C" are entered from the outside of the circuit, so that word lines adjacent to the word line designated by the refresh address "A" are designated based on the test-purpose read/write addresses for taking place the test-purpose read/write operations, and subsequently the word line is designated by the refresh address "A" for taking place the refresh operation of the memory cell. This allows that the test is intentionally and surely made under the worst conditions, wherein adjacent two of the word lines are sequentially activated with a fixed common bit line.

In the above descriptions, one example of the word conditions is that the adjacent two of the word lines are sequentially activated with a fixed common bit line. Notwithstanding, this case is not necessarily the worst case. For example, the worst case might be another case that non-adjacent two word liens are sequentially activated with a fixed common bit line. The worst case might be still another case that the bit lines are different and not common. Further, the tests not only under the worst condition but also under other bad conditions might, in case, be needed. In accordance with the present invention, the refresh addresses for the test operation are controllable in the tester side, so that the test operation can surely be made under any conditions.

Further, in the embodiment, the description has been made in case that the test circuit is integrated in the semiconductor memory device. It is possible, if necessary, that the test circuit and the semiconductor memory device are separated from each other but mounted on the same chip. In either structures, there is no problem, provided that the test circuit and the semiconductor memory device are electrically coupled to each other for transmitting signals and addresses between the test circuit and the semiconductor memory device.

The present invention should not be limited to the structures of the above described embodiment. A variety of modification to the embodiment may be available unless the subject matter of the present invention is changed.

EFFECT OF THE INVENTION

As described above, in accordance with the present invention, in the test operation, the test-purpose refresh address is stored in the internal data storage device, so that the test-purpose addresses corresponding to adjacent word lines to a word line designated by the test-purpose refresh address are applied to the address terminal, whereby the read/write operation is made based on the test-purpose address and subsequently the refresh operation of the memory cell is conducted based on the test-purpose refresh address stored in the data storage device.

Otherwise, the refresh operation of the memory cell is conducted before the read/write operation is made. Namely, the test may be conducted for any address combinations. This allows checking operations in the worst case.

What is claimed is:

1. A test method for a semiconductor memory device with a plurality of memory cells which need,
   wherein during a test operation, there is accomplished, at least one time, a combination of:
   a read/write process for reading or writing a memory cell based on a first address externally entered; and
   a refresh process for refreshing said memory cell based on a second address externally entered,
   and wherein said combination of two processes is made in one cycle.

2. The test method for a semiconductor memory device as claimed in claim 1, wherein said combination of two processes is that after said refresh process is made, then said read/write process is made.

3. The test method for a semiconductor memory device as claimed in claim 1, wherein said combination of two processes is that after said read/write process is made, then said refresh process is made.

4. The test method as claimed in claim 1, further comprising:
   automatically performing self-refresh of the memory cell at a predetermined interval.

5. The test method as claimed in claim 1, wherein the semiconductor memory device is a pseudo SRAM.

6. A test method for a semiconductor memory device with a plurality of memory cells which need refreshes,
   wherein during a test operation, there is accomplished, at least one time, a combination of:
   a read/write process for reading or writing a memory cell based on a first address externally entered; and
   a refresh process for refreshing said memory cell based on a second address externally entered,
   and wherein said read/write process and said refresh process and further subsequent read/write process are accomplished in one cycle.

7. A test method for a semiconductor memory device with a plurality of memory cells which need refreshes,
   wherein during a test operation, there is accomplished, at least one time, a combination of:
   a read/write process for reading or writing a memory cell based on a first address externally entered; and
   a refresh process for refreshing said memory cell based on a second address externally entered,
   and wherein said two processes are made at a common column address and at row addresses close to each other.

8. The test method for a semiconductor memory device as claimed in claim 7, wherein said two processes are made at a common column address and at row addresses adjacent to each other.

9. A test method for a semiconductor memory device with a plurality of memory cells which need refreshes,
   wherein during a test operation, there is accomplished, at least one time, a combination of:
   a read/write process for reading or writing a memory cell based on a first address externally entered; and
   a refresh process for refreshing said memory cell based on a second address externally entered,
   and further including a process of discontinuing the refresh of said memory cell based on a third address generated inside of said semiconductor memory device, in response to a switch of said semiconductor memory device from a normal operation mode to a test mode.

10. The test method for a semiconductor memory device as claimed in claim 9, wherein when a normal operation mode is switched to a test mode based on a mode switching signal externally entered, a test address is selected so that said refresh of said memory cell based on said third address is discontinued.

11. A test method for a semiconductor memory device with a plurality of memory cells which need refreshes,
    wherein during a test operation, there is accomplished, at least one time, a combination of:
    a read/write process for reading or writing a memory cell based on a first address externally entered; and
    a refresh process for refreshing said memory cell based on a second address externally entered,
    and wherein said test operation is that a set of plural row addresses is subject to said refresh process with fixing a column address and sequentially changing row addresses.

12. The test method for a semiconductor memory device as claimed in claim 11, wherein said test operation is that a set of all row addresses is subject to said refresh process with fixing a column address and sequentially changing row addresses.

13. The test method for a semiconductor memory device as claimed in claim 11, wherein said test operation is that a set of respective all row addresses for each of plural blocks divided from a memory cell array is subject to said refresh process with fixing a column address and sequentially changing row addresses.

14. A test method for a semiconductor memory device with a plurality of memory cells which need refreshes,
wherein during a test operation, there is accomplished, at least one time, a combination of:
a read/write process for reading or writing a memory cell based on a first address externally entered; and
a refresh process for refreshing said memory cell based on a second address externally entered,
and wherein both said first address and said second address are externally entered every changes of a row address.

15. A test method for a semiconductor memory device with a plurality of memory cells which need refreshes,
wherein during a test operation, there is accomplished, at least one time, a combination of:
a read/write process for reading or writing a memory cell based on a first address externally entered; and
a refresh process for refreshing said memory cell based on a second address externally entered,
and wherein said first address is externally entered every changes of the row address, while only an initial address of said second address is externally entered, and said second address is automatically changed in accordance with a predetermined constant rule every changes to the row address.

16. The test method for a semiconductor memory device as claimed in claim 15, wherein a predetermined increment of said second address is made every changes to the row address.

17. A test method for a semiconductor memory device with a plurality of memory cells which need refreshes,
wherein during a test operation, there is accomplished, at least one time, a combination of:
a read/write process for reading or writing a memory cell based on a first address externally entered; and
a refresh process for refreshing said memory cell based on a second address externally entered,
and wherein a hold test of a memory cell to be subject to the test is previously tested and a predetermined test pattern is written, before said two processes are accomplished.

18. A semiconductor memory device having a plurality of memory cells which need refresh, a circuit element for supplying a first address, and an access address control circuit for refreshing a memory cell based on an address,
wherein said semiconductor memory device further has:
a circuit for holding a second address externally entered; and
a refresh address switching circuit electrically coupled to said circuit element for supplying said first address and also coupled to said circuit for holding said second address, and in a normal operation mode, said refresh address switching circuit supplies said first address to said access address control circuit, and in a test mode, said refresh address switching circuit supplies said second address to said access address control circuit.

19. The semiconductor memory device as claimed in claim 18, wherein said semiconductor memory device automatically performs self-refresh of the memory cell at a predetermined interval.

20. The semiconductor memory device as claimed in claim 18, wherein said semiconductor memory device is a pseudo SRAM.

21. The semiconductor memory device as claimed in claim 18, wherein said refresh address switching circuit comprises a selecting circuit which is electrically coupled to said circuit element for supplying said first address and also coupled to said circuit for holding said second address, and in said normal operation mode, said selecting circuit selects said first address, and in said test mode, said selecting circuit selects said second address.

22. The semiconductor memory device as claimed in claim 21, wherein said selecting circuit comprises a multiplexer electrically coupled to said circuit element for supplying said first address and also coupled to said circuit for holding said second address.

23. The semiconductor memory device as claimed in claim 18, further including: a control circuit electrically coupled to said refresh address switching circuit for supplying said refresh address switching circuit a control signal which switches between said normal operation mode and said test mode.

24. The semiconductor memory device as claimed in claim 23, wherein said control circuit comprises a test entry circuit which switches between said normal operation mode and said test mode in response to a predetermined external signal.

25. The semiconductor memory device as claimed in claim 18, wherein said circuit for holding said second address comprises a data storage device electrically coupled to said refresh address switching circuit.

26. The semiconductor memory device as claimed in claim 18, further including an address inverting circuit electrically coupled to between said circuit for holding said second address and said refresh address switching circuit for inverting said second address outputted from said circuit for holding said second address, and supplying the same to said refresh address switching circuit.

27. The semiconductor memory device as claimed in claim 18, wherein said circuit element for supplying said first address comprises a refresh address generating circuit connected to said refresh address switching circuit.

28. A test circuit for a semiconductor memory device, said circuit having a plurality of memory cells which need refresh and a circuit element for supplying a first address based on an internal signal,
wherein said test circuit has:
a circuit for holding a second address externally entered; and
a refresh address switching circuit electrically coupled to said circuit element for supplying said first address and also coupled to said circuit for holding said second address, and in a normal operation mode, said test circuit supplies said first address to an access address control circuit, and in a test mode, said test circuit supplies said second address to said access address control circuit.

29. The test circuit as claimed in claim 28, wherein said refresh address switching circuit comprises a selecting circuit which is electrically coupled to said circuit element for supplying said first address and also coupled to said circuit for holding said second address, and in said normal operation mode, said selecting circuit selects said first address, and in said test mode, said selecting circuit selects said second address.

30. The test circuit as claimed in claim 29, wherein said selecting circuit comprises a multiplexer electrically coupled to said circuit element for supplying said first address and also coupled to said circuit for holding data.

31. The test circuit as claimed in claim 28, further including: a control circuit electrically coupled to said refresh address switching circuit for supplying said refresh address switching circuit a control signal which switches between said normal operation mode and said test mode.

32. The test circuit as claimed in claim 31, wherein said control circuit comprises a test entry circuit which switches between said normal operation mode and said test mode in response to a predetermined external signal.

33. The test circuit as claimed in claim 28, wherein said circuit for holding said second address comprises a data storage device electrically coupled to said refresh address switching circuit.

34. The test circuit as claimed in claim 28, further including an address inverting circuit electrically coupled to between said circuit for holding said second address and said refresh address switching circuit for inverting said second address outputted from said circuit for holding said second address, and supplying the same to said refresh address switching circuit.

35. The test circuit as claimed in claim 28, wherein said test circuit is integrated in said semiconductor memory device.

36. The test circuit as claimed in claim 28, wherein said test circuit is separated from said semiconductor memory device and is mounted on a same chip as said semiconductor memory device.

* * * * *